United States Patent
Kyung

(10) Patent No.: US 7,124,250 B2
(45) Date of Patent: Oct. 17, 2006

(54) MEMORY MODULE DEVICE FOR USE IN HIGH-FREQUENCY OPERATION

(75) Inventor: Kye-Hyun Kyung, Yongin (KR)

(73) Assignee: Samsung Electronics Co., Ltd., (KR)

( * ) Notice: Subject to any disclaimer, the term of this patent is extended or adjusted under 35 U.S.C. 154(b) by 271 days.

(21) Appl. No.: 10/739,991

(22) Filed: Dec. 18, 2003

(65) Prior Publication Data
US 2004/0133736 A1    Jul. 8, 2004

(30) Foreign Application Priority Data
Jan. 3, 2003    (KR)    .................. 10-2003-0000216

(51) Int. Cl.
G06F 12/00    (2006.01)
(52) U.S. Cl. .................................... 711/131
(58) Field of Classification Search ............... None
See application file for complete search history.

(56) References Cited

U.S. PATENT DOCUMENTS 5,265,218 A    11/1993    Testa et al. ................ 395/325
6,393,541 B1    5/2002    Fujii ........................ 711/167
6,742,098 B1 *    5/2004    Halbert et al. ............. 711/172
6,952,745 B1 *    10/2005    Dodd et al. .................. 710/35

* cited by examiner

Primary Examiner—Mano Padmanabhan
Assistant Examiner—Duc T Doan
(74) Attorney, Agent, or Firm—Mills & Onello LLP

(57) ABSTRACT

A memory module device for use in a high frequency operation provides for ease in synchronization. In one example, the memory module includes integrated buffers, each having first and second data ports connected to respective data buses in a point-to-point configuration, such that data input through either data port of the first and second data ports is transferred to the memory device and is simultaneously output through the other data port of the first and second data ports. The integrated buffers each further include first and second command address ports connected to respective command address buses in a point-to-point configuration, such that a command address signal input through either port of the first and second command address ports is transferred to the memory device and simultaneously output through the other command address port of the first and second command address ports.

4 Claims, 5 Drawing Sheets

US 7,124,250 B2

MEMORY MODULE DEVICE FOR USE IN HIGH-FREQUENCY OPERATION

BACKGROUND OF THE INVENTION

1. Field of the Invention

The present invention relates to a configuration of a high frequency DRAM module, and more particularly to a memory module device for use in a high-frequency operation.

2. Description of the Related Art

In electronic data processing (EDP) systems such as a personal computer (PC), a work station, a server etc., a memory device that is a main memory is commonly configured in a module in which a plurality of DRAMs are connected with one another via a system bus. To increase the overall efficiency of the EDP system, data transfer between the memory module and a system chip set, for example a CPU etc., must occur at a higher speed.

Referring first to FIG. 1, which illustrates a block diagram of a conventional DRAM module, each of bilateral data buses (hereinafter, referred to as "DQ bus") is connected directly to each of plural DRAMs 10–17 through a connector, and a command-address bus (hereinafter, referred to as "CA bus") is connected to each of the DRAMs 10–17 equipped in the module 50 through a register 20. A memory system employing such a module has a problem in achieving greater than a 600 Mbps/pin data rate in the event that operating frequency is dictated by a 300 MHz dual edge clock, because of the "stub" connection configuration of the respective DQ buses.

To improve this limitation on the operation frequency, referring to FIG. 2, module devices 100, 200 utilize respective buffers 40, 42, 44, 46 for the DQ buses. As shown in FIG. 2, in each DQ buffer 40, 42, 44, 46, two ports PO1, PO2 are allocated to single data, and the single data input through any one of the two ports is re-driven to another port. Further, through one port, input data is transferred to the DRAM or the data output from the DRAM is externally transferred. In such a memory system in which a DRAM module is used and equipped with buffers, all data buses have a "point-to-point" configuration. Thus, these systems enjoy data transfer rates that can be increased up to several gigahertz (GHz).

However, although data operating frequency is increased in the configuration of FIG. 2, the difference in operating frequency between the data DQ and command address CA lines becomes large because the bus structure of the CA line s still in a "stub" configuration. Furthermore, a phase difference is generated, since structures of the data bus DQ and the command address CA bus are different from each other. Further, since a register and a buffer having each of process operations are independent of each other, it is difficult to achieve synchronization between the command address bus CA and the data bus DQ.

SUMMARY OF THE INVENTION

Therefore, an object of the present invention is to provide a memory module device capable of solving the conventional problems.

Another object of the present invention is to provide a memory module device capable of easily controlling a synchronization between data and a command address and easily obtaining a high frequency operation, and of reducing the number of command address pins.

Another object of the present invention is to provide a memory module device capable of simultaneously processing a command-address and data to obtain a high frequency operation.

An additional object of the present invention is to provide a memory module device having an integrated buffer that is capable of simultaneously processing a command-address and data, to obtain a high frequency operation.

A further additional object of the present invention is to provide a memory module device and a method therefor, which has an integrated buffer capable of reducing a propagation delay of a command address.

In one aspect, the present invention is directed to a memory module device having a plurality of memory devices, for example, DRAM devices, connected with one another through buses. The module device comprises multiple data buffers, each having first and second data ports connected to respective data buses in a point-to-point configuration, such that data input through either data port of the first and second data ports is transferred to the memory device and is simultaneously output through the other data port of the first and second data ports. The device further includes at least one command address register, having first and second command address ports connected to respective command address buses in a point-to-point configuration, such that a command address signal input through either port of the first and second command address ports is transferred to the memory device and simultaneously output through the other command address port of the first and second command address ports.

In another aspect, the present invention is directed to a memory module device having a plurality of memory devices, for example DRAMs, connected with one another through buses. The module device comprises integrated buffers, each having first and second data ports connected to respective data buses in a point-to-point configuration, such that data input through either data port of the first and second data ports is transferred to the memory device and is simultaneously output through the other data port of the first and second data ports. The integrated buffers further each include a command address port connected to a respective command address bus in a stub configuration such that a command address signal input through the command address port is transferred to the memory device.

In this example, the transmission frequency of the command address signal is, for example, determined as 1/N of a transmission frequency of the data, where N is a natural number.

In another aspect, the present invention is directed to a memory module device having a plurality of memory devices connected with one another through buses. The module device comprises integrated buffers, each having first and second data ports connected to respective data buses in a point-to-point configuration, such that data input through either data port of the first and second data ports is transferred to the memory device and is simultaneously output through the other data port of the first and second data ports. The integrated buffers further include first and second command address ports connected to respective command address buses in a point-to-point configuration, such that a command address signal input through either port of the first and second command address ports is transferred to the memory device and simultaneously output through the other command address port of the first and second command address ports.

According to the configuration of the present invention, data signals and command address signals can be readily synchronized, and high frequency operation can be readily obtained.

BRIEF DESCRIPTION OF THE DRAWINGS

The above features and advantages of the present invention will become more apparent by describing in detail exemplary embodiments thereof with reference to the attached drawings in which.

DETAILED DESCRIPTION OF PREFERRED EMBODIMENTS

The present invention and exemplary embodiments thereof are more fully described below with reference to the accompanying drawings. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art. Accordingly, details of like components have been omitted so that the invention can be clearly presented, and like components have like reference symbols and numerals.

Figure 3:
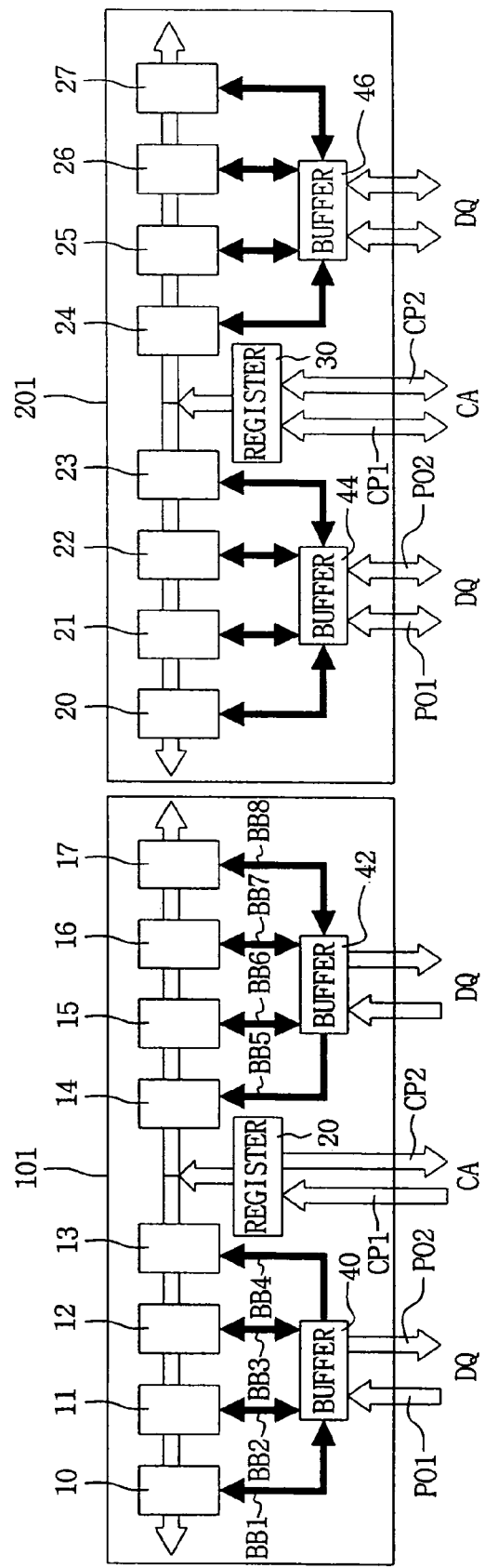
FIGS. 3, 4 and 5 are block diagrams of a memory module device according to first through third exemplary embodiments of the present invention.
Figure 4:
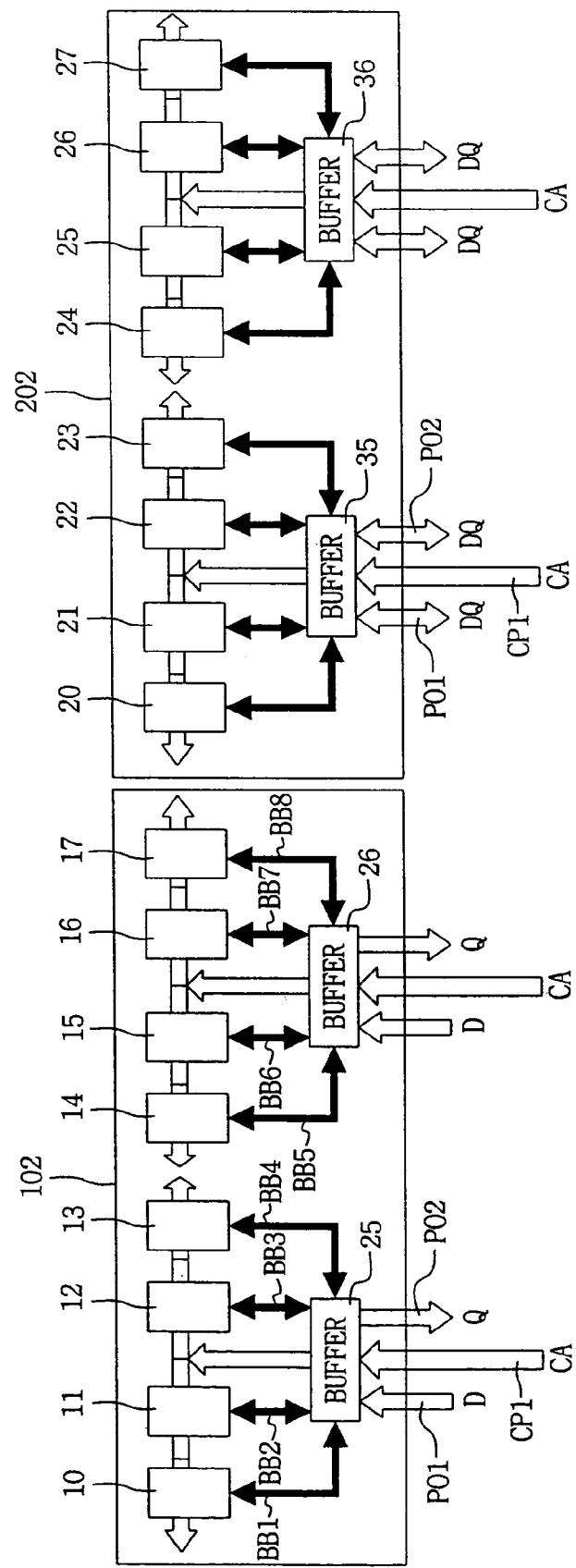
Figure 5:
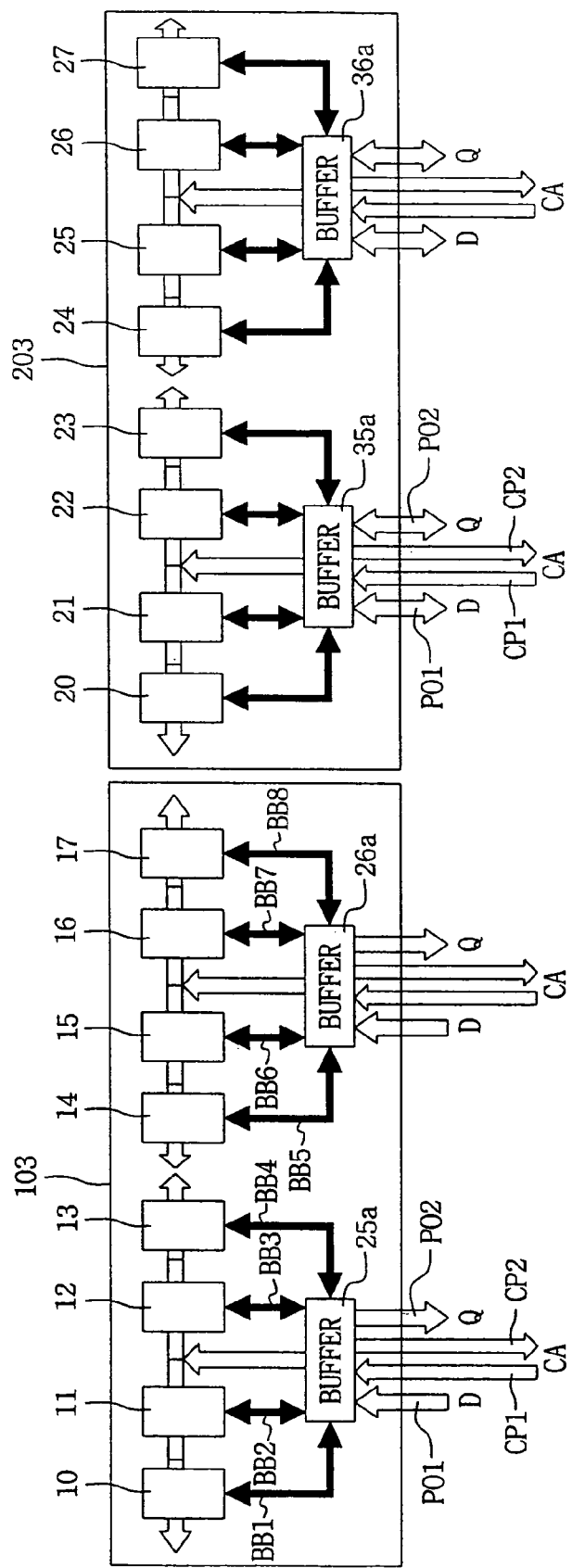

FIGS. 3, 4, and 5 are block diagrams of a memory module device according to first, second and third exemplary embodiments of the present invention.

Referring first to FIG. 3, memory module devices 101, 201, include a plurality of respective memory devices 10–17, 20–27 that are connected with one another through buses that are in turn connected to an external chip set (not shown). Data buffers 40, 42, 44, 46, for which data buses have a point-to-point structure in which two ports PO1, PO2 are allocated to single data. Data that are input through any one port of the two ports are transferred to the memory device and simultaneously are output through another port. Command address registers 20, 30, and associated command address CA buses have a point-to-point structure in which two ports CP1, CP2 are allocated to one command address. A command address CA input through any one port of the two ports is transferred to the memory device and simultaneously is output through another port.

Figure 1:
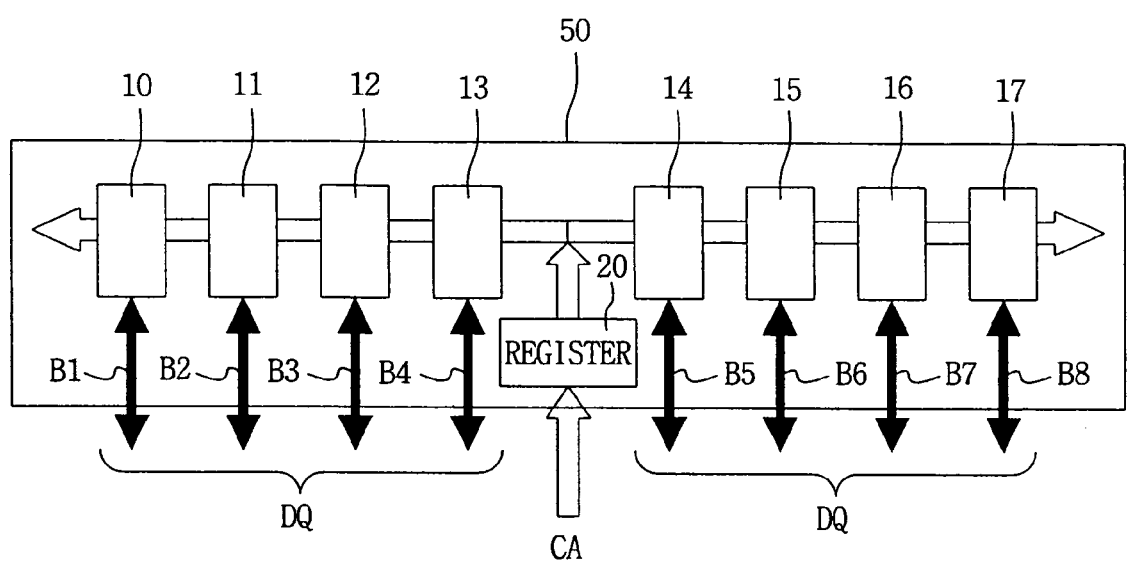
FIGS. 1 and 2 are block diagrams of conventional memory module devices.
Figure 2:
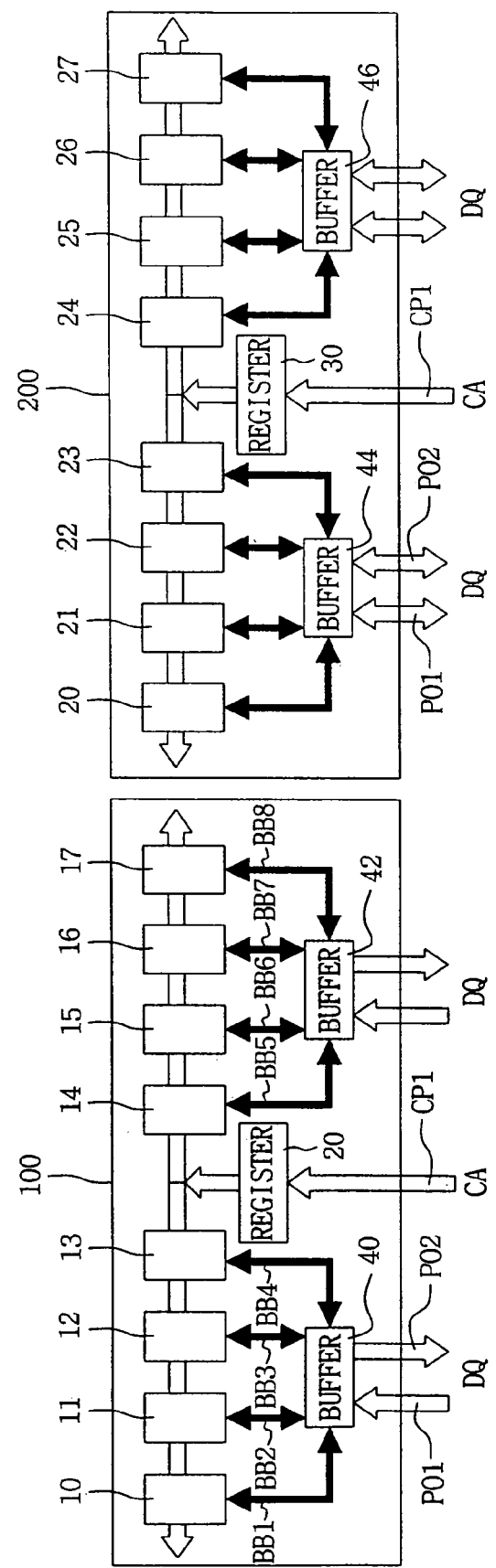

As a consequence, as distinguished from the configuration of FIG. 2, the device referred to FIG. 3 has the same structure in the CA bus and the DQ bus, that is, the CA bus has a point-to-point structure, as does the DQ bus. The memory module devices of FIG. 3 individually include the CA registers 20, 30 in which two ports CP1, CP2 are allocated to one signal, thus the problems mentioned above associated with the conventional device shown in FIG. 2 above are resolved herein.

The CA register 20, 30 transfers the CA signal input through one port, to the DRAM, and outputs the CA signal through another port. In this manner, the command address bus CA and the data bus DQ have the same structure so that the operating frequency of the CA bus is equal to an operating frequency of the DQ bus. Therefore, synchronization between the CA and the DQ can be readily obtained. It is of course valid to reduce the number of CA pins at the connector of the module by defining one command through a multi tick process because the frequency of the CA is high.

As described above, the structure of the device referred to in FIG. 3 results in synchronization of the CA and the DQ buses, in a simpler configuration as compared with the conventional art. However, the CA registers 20, 30 are individually disposed at each central portion of the module devices to drive the DRAMs with the received CA signals, thus the propagation distance between the CA register 20 and first DRAM 10, and the propagation distance between the CA register 20 and a fourth DRAM 13, are different from each other. That is, if the distances between the CA register and each of the respective DRAMs are different, the CA signal reaching each DRAM is delayed by a tPD (propagation delay) of the CA. In a general single-side ECC DRAM module, the CA register drives at maximum five DRAMs in one direction, and in a double side module, the CA register drives at maximum ten DRAMs in one direction. The difference in the propagation delay tPD between the five DRAMs is generally over 400 ps, and this difference in propagation delay tPD limits high-speed operation of the device.

FIG. 4 is a block diagram of a second exemplary embodiment of the present invention. While sharing many similarities with the structure of FIG. 3, the structure of FIG. 4 provides an integrated buffer 25 obtained by integrating, for example, within a single chip, the CA register 20 and the DQ buffer 40 shown in FIG. 3. Buffers 26, 35, 36 are likewise integrated. In the configuration of FIG. 4, the DQ bus has the "point-to-point" bus structure and the CA bus has the "stub" bus structure. In this case though, the integrated buffer 25 has sufficient time to input the CA signal if the CA signal is processed within 1/N of the DQ signal frequency, where 'N' represents the number of memory devices 10–17, 20–27 serviced by a single buffer 25, 26, 35, and 36, because the single integrated buffer 25 processes all of the CA and DQ signals. In this structure, the CA signals and the data signals are simultaneously driven in one integrated buffer, thus the CA and the DQ can be readily synchronized. Further, the number of DRAMs 10–13, which are driven by one integrated buffer 25, is reduced to half as compared with the configuration of FIG. 3, so the propagation delay tPD of the CA signal is reduced to approximately half of that of the structure referred to in FIG. 3. That is, the propagation delay tPDs difference for the CA signal to reach each of the DRAMs is reduced, to thus much more improve the operating frequency.

FIG. 5 is a block diagram illustrating a third embodiment of the present invention. In the structure of FIG. 5, the CA register and the DQ buffer are once again integrated into a single chip 25A, 26A, 35a, 36a, as in the structure of FIG. 4, and further, all DQ buses and CA buses have the "point-to-point" bus structure. Therefore, since the CA signals and the DQ signals are synchronized in the memory system, the integrated buffer becomes released from the operation of synchronizing the CA and the DQ. Moreover, the CA and the DQ are simultaneously driven toward the DRAM from a single integrated chip, thus the CA and the DQ are synchronized easily at the DRAM. Also, as in the configuration of FIG. 4, the number of DRAMs driven by one integrated buffer is reduced to half, thus the propagation delay tPD of the CA signal is reduced to a half in comparison with the configuration of FIG. 3. As a result, operating frequency is improved, as discussed above. In this case, further, the frequency of the CA signal is high enough to define one command through a multi tick, thereby reducing the number of CA pins.

As described above, in a memory module device of the present invention, the data signals and the command address signals can be readily synchronized, and high frequency operation can be readily obtained. In addition, the number of command address pins can be reduced.

While the present invention has been particularly shown and described with reference to exemplary embodiments thereof, it will be understood by those of ordinary skill in the art that various changes in form and details may be made herein without departing from the spirit and scope of the present invention as defined by the following claims.

What is claimed is:

1. A memory module device having a plurality of memory devices connected with one another through buses comprising:
   integrated buffers each including a data buffer and a command address register integrated within a single chip, each having first and second data ports connected to respective data buses in a point-to-point configuration, such that data input through either data port of the first and second data ports is transferred to the memory device and is simultaneously output through the other data port of the first and second data ports, and each having a command address port connected to a respective command address bus in a stub configuration such that a command address signal input through the command address port is transferred to the memory device.

2. The device of claim 1, wherein the memory devices comprise DRAMs.

3. The device of claim 1, wherein a transmission frequency of the command address signal is determined as 1/N of a transmission frequency of the data, where N is a natural number.

4. A memory module device having a plurality of memory devices connected with one another through buses comprising:
   integrated buffers each including a data buffer and a command address register integrated within a single chip, each having first and second data ports connected to respective data buses in a point-to-point configuration, such that data input through either data port of the first and second data ports is transferred to the memory device and is simultaneously output through the other data port of the first and second data ports,
   and each having first and second command address ports connected to respective command address buses in a point-to-point configuration, such that a command address signal input through either port of the first and second command address ports is transferred to the memory device and simultaneously output through the other command address port of the first and second command address ports.

* * * * *